(12) United States Patent
Huester et al.

(10) Patent No.: US 11,904,756 B2
(45) Date of Patent: Feb. 20, 2024

(54) METHOD FOR CONTROLLING A HEADLAMP OF A MOTOR VEHICLE

(71) Applicant: Hella GmbH & Co. KGaA, Lippstadt (DE)

(72) Inventors: Christian Huester, Salzkotten (DE); Boris Kubitza, Moehnesee-Koerbecke (DE); Martin Pluempe, Bad Wuennenberg (DE); Udo Venker, Guetersloh (DE); Carsten Wilks, Lippstadt (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 287 days.

(21) Appl. No.: 17/514,565

(22) Filed: Oct. 29, 2021

(65) Prior Publication Data

US 2022/0048426 A1 Feb. 17, 2022

Related U.S. Application Data

(63) Continuation of application No. PCT/EP2020/057774, filed on Mar. 20, 2020.

(30) Foreign Application Priority Data

Apr. 29, 2019 (DE) ...................... 10 2019 111 007.6

(51) Int. Cl.
*H03K 17/00* (2006.01)
*B60Q 1/06* (2006.01)
(Continued)

(52) U.S. Cl.
CPC ............. *B60Q 1/06* (2013.01); *H05B 47/155* (2020.01); *B60Q 2400/50* (2013.01); *H03K 17/78* (2013.01)

(58) Field of Classification Search
CPC .... B60Q 1/06; B60Q 2400/50; H05B 47/155; H03K 17/78; H04N 9/3138; H04N 9/3155; H04N 9/3188
See application file for complete search history.

(56) References Cited

U.S. PATENT DOCUMENTS 6,124,886 A * 9/2000 DeLine ............... B60Q 1/2665
348/148
2006/0012610 A1 1/2006 Karlov
(Continued)

FOREIGN PATENT DOCUMENTS

| DE | 102012003158 A1 | 8/2013 |
| DE | 102014000935 A1 | 7/2015 |
| WO | WO2018050593 A1 | 3/2018 |

OTHER PUBLICATIONS

International Search Report dated Jul. 13, 2020 in corresponding application PCT/EP2020/057774.

*Primary Examiner* — Tuan T Lam
(74) *Attorney, Agent, or Firm* — Muncy, Geissler, Olds & Lowe , P.C.

(57) ABSTRACT

A method for controlling a headlamp of a motor vehicle, the headlamp comprising a plurality of light sources. A projection symbol to be projected by the headlamp and a position and a size of the projection symbol are determined. A respective first luminous intensity for the light sources for the projection of the projection symbol at the position with the size and a first indicator, which contains an indication of how greatly the individual first luminous intensities differ from one another are determined. The position and/or the size of the projection symbol is changed. A respective second luminous intensity for the light sources for the projection of the projection symbol at the changed position and/or with the changed size and a second indicator, which contains an indication of how greatly the individual second (Continued)

luminous intensities differ from one another are determined.
The projection symbol subsequently projected.

9 Claims, 1 Drawing Sheet

(51) Int. Cl.
  *H05B 47/155* (2020.01)
  *H03K 17/78* (2006.01)

(56) References Cited

U.S. PATENT DOCUMENTS

2017/0307162 A1* 10/2017 Courcier ................. F21S 41/18
2018/0086254 A1*  3/2018 Morel ..................... B60Q 1/04
2023/0232511 A1*  7/2023 Encinas Gomar ... H05B 45/325
                                                    315/82

* cited by examiner

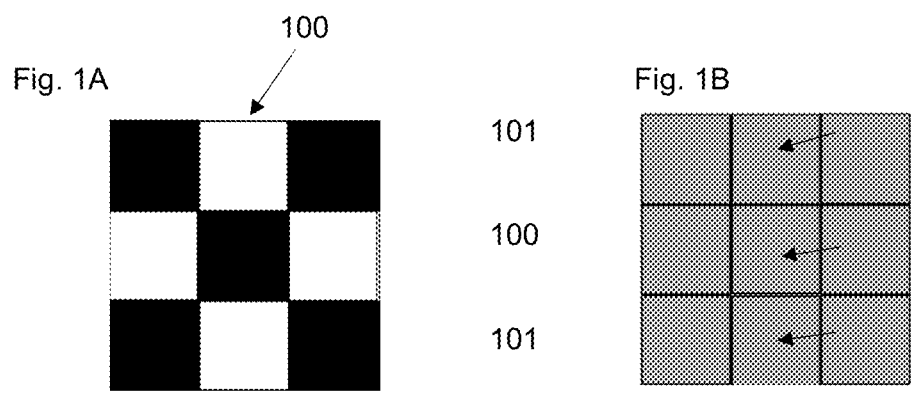
Fig. 1A
Fig. 1B
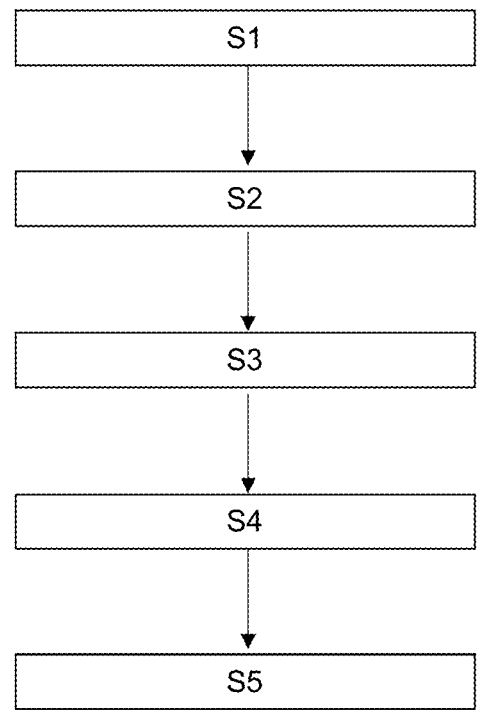
Fig. 2

METHOD FOR CONTROLLING A HEADLAMP OF A MOTOR VEHICLE

This nonprovisional application is a continuation of International Application No. PCT/EP2020/057774, which was filed on Mar. 3, 2020, and which claims priority to German Patent Application No. 10 2019 111 007.6 which was filed in Germany on Apr. 29, 2019, and which are both herein incorporated by reference.

BACKGROUND OF THE INVENTION

Field of the Invention

The present invention relates to a method for controlling a headlamp of a motor vehicle.

Description of the Background Art

Headlamps are known that are designed to project symbols into a user's field of vision. For example, traffic signs can be projected onto the road so that the user is specifically made aware of the traffic signs.

US 2018/0086254 A1 discloses a method by which the contrast of the symbol to be displayed is to be particularly strong so that it can be particularly well recognized by the user.

SUMMARY OF THE INVENTION

It is therefore an object of the present invention to provide a method in which the symbol to be projected can be recognized even better by a user. Furthermore, such a headlamp and a motor vehicle with such a headlamp are to be created.

In an exemplary embodiment, the headlamp includes a plurality of light sources. According to the method, a projection symbol to be projected by the headlamp is determined. This may be, for example, a road traffic symbol that can be familiar to a user from a road traffic sign. The position and size of the projection symbol are determined. Subsequently, a first luminous intensity for the projection of the projection symbol at the position with the size is determined for each of the light sources. The luminous intensity can be different for each of the light sources. It is also possible that for one or more light sources 0 is determined as the luminous intensity.

A first indicator is determined, which contains an indication of how greatly the individual first luminous intensities differ from one another. For example, a higher value can mean that the first luminous intensities differ relatively significantly from one another.

Then, the position and/or the size of the projection symbol are changed. With this changed position and/or with the changed size, a second luminous intensity is determined for each of the light sources for the projection of the projection symbol. A second indicator is determined, which contains an indication of how greatly the individual second luminous intensities differ from one another.

The first indicator is then compared with the second indicator, and it is determined whether the first or the second luminous intensity is used as a usage luminous intensity, in accordance with the comparison of the first indicator with the second indicator. The usage luminous intensity is then used to project the projection symbol with the headlamp.

By changing the position and/or the size of the projection symbol, it may be possible to achieve a stronger contrast in individual areas or for the entire projection symbol, since the changed projection symbol may be better displayed by the light sources. For example, if a pixel of the symbol is to be represented exactly by one light source, this light source can be adjusted exactly to the desired luminous intensity. However, if a pixel of the symbol has to be represented by several light sources, because, for example, due to its position, half of it has to be represented by a first light source and the other half by a second light source, the contrast of the projection symbol in this area is reduced.

Some steps of the method can also be carried out multiple times, so that an iterative approximation can be made to luminous intensities with which the projection symbol is particularly well represented. In particular, the steps described above starting with the change of size and/or position can be carried out several times.

According to an example, the projection symbol may be determined from a source symbol, such as a traffic sign, with individual image points. The image points may also be referred to as pixels. A third indicator may be determined, which contains an indication of how greatly the brightnesses of the individual pixels differ from one another. Then, a first difference between the third indicator and the first indicator and a second difference between the third indicator and the second indicator can be determined. The first luminous intensity can then be determined as a usage luminous intensity if the first difference is less than the second difference. The second luminous intensity can be determined as a usage luminous intensity if the second difference is less than the first difference. Thus, the luminous intensity whose indicator differs less from the third indicator can be used.

The light sources of the headlamp can be divided into rows and columns. The pixels of the source symbol can also be divided into rows and columns. In particular, it is possible that the number of rows and columns for the light sources corresponds to the number of rows and columns for the pixels. For the light sources when using the first luminous intensity as well as for the light sources when using the second luminous intensity and for the pixels, a number of boundaries can be determined for each row and column. A boundary can be determined if a difference in brightness between two adjacent light sources or two adjacent pixels is greater than a threshold value.

The first indicator can then be equal to the sum of all the boundaries of the light sources when using the first luminous intensities. The second indicator can be equal to the sum of all boundaries of the light sources when using the second luminous intensities. The third indicator can be equal to the sum of all the boundaries of the pixels.

The light sources of the headlamp can be divided into a number of rows and columns. The pixels of the source symbol can be divided into the same number of rows and columns, so that each row and each columns of the light sources corresponds to a column and a row of the pixels. A number of boundaries can be determined for each row and each column for both the light sources when using the first luminous intensities and the light sources when using the second luminous intensities, and for the pixels. A boundary can be determined if a difference in brightness between two adjacent light sources or two adjacent pixels is greater than a threshold value.

The first indicator can be equal to the number of boundaries in the column or row of light sources when using the first luminous intensity that has the greatest difference to the number of boundaries in the corresponding column or row of pixels. The second indicator can be equal to the number of boundaries in the corresponding column or row of light sources when using the second luminous intensities. The third indicator can be equal to the number of boundaries in the corresponding column or row of pixels.

The first luminous intensity can be determined as a usage luminous intensity if the first luminous intensities differ more greatly from one another than the second luminous intensities. The second luminous intensity may be determined as a usage luminous intensity if the second luminous intensities differ more greatly from one another than the first luminous intensities.

In order to determine how greatly the first luminous intensities differ from one another, a first mean value of all first luminous intensities and a first sum of the deviations of the individual first luminous intensities from this first mean value can be determined. The first mean value can in particular be the average of the first luminous intensities. To determine how greatly the second luminous intensities differ from one another, a second mean value of all second luminous intensities and a second sum of the deviations of the individual second luminous intensities from this second mean value can be determined. In particular, the second mean value can be the average of the second luminous intensities.

The first luminous intensities differ more greatly from one another than the second luminous intensities when the first sum is greater than the second sum. The second luminous intensities differ more greatly from one another than the first luminous intensities when the second sum is greater than the first sum.

A number of boundaries can be determined in the projection symbol. A boundary is determined if a difference in brightness between two adjacent pixels is greater than a threshold value. A pixel area is determined in which the number of boundaries per pixel is greater than a threshold value. The luminous intensity of one or more light sources can then be changed in a light source area corresponding to the pixel area.

In this way, the contrast can be further increased in a pixel area with a relatively large number of boundaries. If, for example, a relatively narrow strip is to be displayed, it may be advantageous to change the luminous intensity of one or more light sources, which may change the width of the strip. However, the contrast may be increased as a result. For example, if the stripe has a width corresponding to one light source, and because of its position it is to be represented by two light sources, it may be better represented by a single light source. This may result in distortions in the projected symbol. Nevertheless, the symbol can then be better recognized by the user.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIGS. 1A and 1B show two schematic views of a projection symbol; and

FIG. 2 is a schematic flow diagram of a method according to one embodiment of the invention.

DETAILED DESCRIPTION

FIG. 1A shows a projection symbol with several alternating bright areas 100 and dark areas 101. Each bright area 100 and each dark area 101 corresponds to a pixel to be projected. Ideally, the projection symbol has a position and a size such that each pixel corresponds to a light source of the headlamp. If this is the case, the luminous intensity of the light sources can be set in proportion to the brightness of the respective pixel. A particularly high contrast and good visibility are thus achieved.

However, if due to size and/or position, not every pixel of the projection symbol also corresponds to exactly one light source, then the symbol projected by the headlamp may look as shown in FIG. 1B. This may be the case if the pixels are shifted in the horizontal direction by half a pixel width relative to the light sources. In this case, each pixel is represented by two light sources. Since pixels with full brightness alternate with dark pixels, a luminous intensity of 50% is determined for each light source, so that there is no longer any contrast, and no symbol can be recognized.

Thus, by changing the position and/or size of the projection symbol, the visibility of the symbol can be improved. For example, if the horizontal position of a projected symbol as in FIG. 1B is shifted by half a light source width, the symbol of FIG. 1A may be achieved with a much better contrast.

In practice, a symbol like the one in FIG. 1A will not be projected by a headlamp. The principle of achieving the greatest possible contrast between light and dark, however, remains the same for any other symbol, so that a user can easily recognize the symbols.

In order to be able to decide at which position and size the projection symbol is particularly easy for a user to recognize, a mean value of the luminous intensities of the light sources can be determined, for example. This mean value is equal to 50% in both FIG. 1A and FIG. 1B. However, the deviations from the mean value are much greater in FIG. 1A than in FIG. 1B. The sum of the deviations from the mean value is therefore a possible criterion to determine with how high a contrast the projection symbol is projected.

Another criterion is to divide the projection symbol into columns and rows and then determine the number of boundaries in each column and in each row. A boundary is understood to mean that the luminous intensities of two adjacent light sources differ by more than one boundary value. In FIG. 1A, each column and each row has two boundaries. In FIG. 1B, each column and each row does not have a single boundary. Thus, a particularly high-contrast symbol can also be achieved by maximizing the boundaries.

It is also possible that only the column or row is taken into account for which the number of boundaries differs the most from the number of boundaries in the respective column or row of pixels. If this difference is minimized, it can also be assumed that the symbol is particularly easy to recognize.

In the method shown in FIG. 2, a symbol to be projected by the headlamp is first selected in step S1. Then, in step S2, the position, the size and a projection surface are determined. The contrast is then optimized in step S3 as described above by changing the size and/or the position of the projection symbol.

In an optional step S4, further optimization can be performed in a specific pixel area to further improve the contrast. This can be useful when there are relatively narrow areas, such as stripes, in the symbol. For example, if a stripe with a width that can be represented by a single light source at full luminous intensity has a position such that it is represented by two light sources each at half luminous intensity, it may be advantageous to represent the stripe with only one of the two light sources at full luminous intensity, even though this changes the position and/or the shape of the stripe. The result can be a slightly distorted projection symbol with improved contrast. This is easier for a user to recognize despite the possible distortion.

In the last step S5, the projection symbol is then projected with the contrast ratio optimized as described before.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for controlling a headlamp of a motor vehicle, the headlamp comprising a plurality of light sources, the method comprising:
    determining a projection symbol to be projected by the headlamp;
    determining a position and a size of the projection symbol;
    determining a respective first luminous intensity for the light sources for the projection of the projection symbol at the position with the size;
    determining a first indicator, which contains an indication of how greatly the individual first luminous intensities differ from one another;
    changing the position and/or the size of the projection symbol;
    determining a respective second luminous intensity for the light sources for the projection of the projection symbol at the changed position and/or with the changed size;
    determining a second indicator, which contains an indication of how greatly the individual second luminous intensities differ from one another;
    comparing the first indicator with the second indicator;
    determining whether the first or the second luminous intensity is used as a usage luminous intensity, in accordance with the comparison of the first indicator with the second indicator, the projection symbol being projected with the usage luminous intensity via the headlamp.

2. The method according to claim 1, wherein the projection symbol is determined from a source symbol having individual pixels, comprising:
    determining a third indicator, which contains an indication of how greatly the brightnesses of the individual pixels differ from one another;
    determining a first difference between the third indicator and the first indicator and a second difference between the third indicator and the second indicator;
    determining the first luminous intensities as the usage luminous intensity when the first difference is less than the second difference; and
    determining the second luminous intensities as the usage luminous intensity when the second difference is less than the first difference.

3. The method according to claim 1, wherein the light sources of the headlamp are divided into rows and columns, wherein the pixels of the source symbol are divided into rows and columns, a number of boundaries being determined for each row and each column both for the light sources when using the first luminous intensities and for the light sources when using the second luminous intensities and for the pixels, wherein a boundary is determined if a difference in brightness between two adjacent light sources or two adjacent pixels is greater than a threshold value, the first indicator being equal to the sum of all the boundaries of the light sources when using the first luminous intensities, wherein the second indicator is equal to the sum of all the boundaries of the light sources when using the second luminous intensities, and wherein the third indicator is equal to the sum of all the boundaries of the pixels.

4. The method according to claim 2, wherein the light sources of the headlamp are divided into a number of rows and columns, wherein the pixels of the source symbol are divided into the same number of rows and columns so that a column and a row of the pixels correspond to each row and column of the light sources, wherein, for both the light sources when using the first luminous intensities and the light sources when using the second luminous intensities and for the pixels, a number of boundaries is determined for each row and each column, wherein a boundary is determined when a difference in brightness between two adjacent light sources or two adjacent pixels is greater than a threshold value, wherein, when using the first luminous intensities, the first indicator is equal to the number of boundaries in the column or row of light sources which has the greatest difference to the number of boundaries in the corresponding column or row of pixels, wherein the second indicator is equal to the number of boundaries in the corresponding column or row of light sources when using the second luminous intensities, and wherein the third indicator is equal to the number of boundaries in the corresponding column or row of pixels.

5. The method according to claim 1, wherein the first luminous intensity is determined to be the usage luminous intensity when the first luminous intensities differ more greatly from one another than the second luminous intensities, and in that the second luminous intensity is determined to be the usage luminous intensity when the second luminous intensities differ more greatly from one another than the first luminous intensities.

6. The method according to claim 1, wherein, in order to determine how greatly the first luminous intensities differ from one another, a first mean value of all first luminous intensities and a first sum of the deviations from this first mean value are determined, wherein in order to determine how greatly the second luminous intensities differ from one another, a second mean value of all second luminous intensities and a second sum of the deviations from this second mean value are determined, wherein the first luminous intensities differ from one another more greatly than the second luminous intensities when the first sum is greater than the second sum, and wherein the second luminous intensities differ from one another other more greatly than the first luminous intensities when the second sum is greater than the first sum.

7. The method according to claim 1, wherein a number of boundaries is determined in the projection symbol, a boundary being determined when a difference in brightness between two adjacent pixels is greater than a threshold value, wherein a pixel area in which the number of boundaries per pixel is greater than a threshold value is determined, the luminous intensity of one or more light sources in a light source area corresponding to the pixel area being changed after the usage luminous intensity has been determined.

8. A headlamp for a motor vehicle, the headlamp comprising:
   a plurality of light sources; and
   a controller adapted to perform the method according to claim 1.

9. A motor vehicle, comprising a headlamp according to claim 8.

\* \* \* \* \*